US012666961B2

(12) United States Patent
Raghunathan et al.

(10) Patent No.: US 12,666,961 B2
(45) Date of Patent: Jun. 23, 2026

(54) HEATER ELEMENTS

(71) Applicant: GlobalFoundries U.S. Inc., Malta, NY (US)

(72) Inventors: Uppili S. Raghunathan, Essex Junction, VT (US); Vibhor Jain, Williston, VT (US); Yves T. Ngu, Williston, VT (US); Johnatan A. Kantarovsky, South Burlington, VT (US); Sebastian T. Ventrone, South Burlington, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 573 days.

(21) Appl. No.: 18/099,389

(22) Filed: Jan. 20, 2023

(65) Prior Publication Data

US 2024/0249992 A1     Jul. 25, 2024

(51) Int. Cl.
*H10W 40/10*          (2026.01)
*H10D 10/80*          (2025.01)

(52) U.S. Cl.
CPC .......... *H10W 40/10* (2026.01); *H10D 10/821* (2025.01)

(58) Field of Classification Search
CPC ..... H01L 23/345; H01L 23/34; H01L 21/324; H10D 10/821; H10D 62/115; H10D 62/137; H10D 10/021; H10D 84/121; H10D 10/80
See application file for complete search history.

(56) References Cited

U.S. PATENT DOCUMENTS

| | | | |
|---|---|---|---|
| 4,710,794 A | 12/1987 | Koshino et al. | |
| 6,365,447 B1 | 4/2002 | Hebert et al. | |
| 6,559,030 B1 | 5/2003 | Doan et al. | |
| 7,253,477 B2 | 8/2007 | Loechelt et al. | |
| 7,303,968 B2 | 12/2007 | Dunn et al. | |
| 7,569,872 B1 | 8/2009 | Rajavel et al. | |
| 7,704,847 B2 | 4/2010 | Cannon et al. | |
| 7,936,041 B2 | 5/2011 | Johnson et al. | |
| 8,159,814 B2 | 4/2012 | Wang et al. | |
| 9,029,229 B2 | 5/2015 | Adkisson et al. | |
| 9,159,817 B2 | 10/2015 | Camillo-Castillo et al. | |
| 9,368,608 B1 | 6/2016 | Camillo-Castillo et al. | |
| 9,577,035 B2 | 2/2017 | Hurwitz et al. | |
| 9,653,566 B2 | 5/2017 | Camillo-Castillo et al. | |
| 9,722,057 B2 | 8/2017 | Camillo-Castillo et al. | |

(Continued)

FOREIGN PATENT DOCUMENTS

| | | |
|---|---|---|
| CN | 106298770 | 1/2017 |
| WO | 2021/206776 | 10/2021 |

OTHER PUBLICATIONS

Partial European Search Report and Opinion dated Apr. 19, 2024 in related EP Application No. 23202560.1-1211, 16 pages.

(Continued)

*Primary Examiner* — Syed I Gheyas
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to heater elements, methods of operation and methods of manufacture. The structure includes: an active device; a heater element under the active device and within a semiconductor substrate; and a contact to the heater element and the active device.

18 Claims, 7 Drawing Sheets

(56) References Cited

U.S. PATENT DOCUMENTS

| | | | |
|---|---|---|---|
| 9,748,114 B2 | 8/2017 | Cheng et al. | |
| 10,388,728 B1 | 8/2019 | Zierak et al. | |
| 10,446,643 B2 | 10/2019 | Adusumilli et al. | |
| 10,692,753 B2 | 6/2020 | Jaffe et al. | |
| 10,903,316 B2 | 1/2021 | Stamper et al. | |
| 11,016,055 B2 | 5/2021 | Campanella-Pineda et al. | |
| 11,056,382 B2 | 7/2021 | Adusumilli et al. | |
| 11,271,077 B2 | 3/2022 | Stamper et al. | |
| 2003/0015767 A1 | 1/2003 | Emrick et al. | |
| 2004/0222486 A1 | 11/2004 | Ellis-Monaghan et al. | |
| 2006/0076629 A1 | 4/2006 | Yilmaz | |
| 2006/0103007 A1 | 5/2006 | Aitken et al. | |
| 2006/0118912 A1* | 6/2006 | Guarin | H10D 84/125 |
| | | | 257/578 |
| 2006/0278950 A1* | 12/2006 | Tai | H01L 21/76264 |
| | | | 257/501 |
| 2007/0268736 A1* | 11/2007 | Cannon | H01L 23/345 |
| | | | 257/E23.081 |
| 2008/0102568 A1 | 5/2008 | Ouyang et al. | |
| 2008/0217742 A1 | 9/2008 | Johnson et al. | |
| 2010/0182729 A1 | 7/2010 | Wang et al. | |
| 2011/0299317 A1 | 12/2011 | Shaeffer et al. | |
| 2013/0126508 A1 | 5/2013 | Salzman et al. | |
| 2013/0187198 A1 | 7/2013 | Camillo-Castillo et al. | |
| 2017/0062595 A1 | 3/2017 | Dungan et al. | |
| 2018/0083098 A1 | 3/2018 | Goktepeli | |
| 2020/0219760 A1 | 7/2020 | Kantarovsky et al. | |
| 2022/0238646 A1 | 7/2022 | Levy et al. | |

OTHER PUBLICATIONS

Complete European Search Report and Opinion dated Jun. 13, 2024 in related EP Application No. 23202560.1-1211, 16 pages.

European Search Report and Opinion dated Jul. 10, 2024 in related EP Application No. 23202561.9-1211/4404245, 11 pages.

Ildefonso et al., "Comparison of Single-Event Transients in SiGe HBTs on Bulk and Thick-Film SOI", IEEE Transactions on Nuclear Science, vol. 67, Issue 1, Jan. 2020, Abstract, 3 pages.

Specification and Drawings for U.S. Appl. No. 17/707,273, filed Mar. 29, 2022, 27 pages.

Cai et al., "High Performance Isolated LDMOS with Source Spacer and Asymmetric Hetero-doped Architectures", IEEE, Proceedings of the 17 International Symposium on Power Semiconductor Devices & IC's, May 23-26, 2005, 4 pages.

Nergui et al., "Total-Ionizing-Dose Response of SiGe HBTs at Elevated Temperatures", IEEE Transactions on Nuclear Science, Apr. 1, 2022, Abstract, 3 pages.

Specification and Drawings for U.S. Appl. No. 17/671,879, filed Feb. 15, 2022, 19 pages.

Cressler, J.D., "Radiation Effects in SiGe Technology", IEEE Transactions on Nuclear Science, vol. 60, Issue 3, Jun. 2013, Abstract, 2 pages.

Song et al., "An Investigation of the Use of Inverse-Mode SiGe HBTs as Switching Pairs for SET-Mitigated RF Mixers", IEEE Transactions on Nuclear Science, vol. 63, Issue 2, Apr. 2016, Abstract, 2 pages.

Non-Final Office Action dated Sep. 19, 2025 in U.S. Appl. No. 18/099,366 38 pages.

* cited by examiner

HEATER ELEMENTS

BACKGROUND

The present disclosure relates to semiconductor structures and, more particularly, to heater elements, methods of operation and methods of manufacture.

Transistors undergo oxide interface degradation from radiation-rich environments and aggressive biasing. As a result, devices see electrical shifts accumulating over lifetime of a circuit and device.

More specifically, microelectronic devices can degrade when subjected to a single-event upset (SEU), also known as a single-event error (SEE). A SEU is a change of state caused by one single ionizing particle (e.g., ions, electrons, photons, etc.) striking a sensitive node in a microelectronic device, such as in microprocessor, semiconductor memory or power transistor. The state change is a result of the free charge created by ionization in or close to an important node of a logic element. The error in device output or operation caused as a result of the strike is called an SEU or a soft error.

Microelectronics can also suffer long-term effects due a total ionizing dose (TID). For example, cumulative long term ionizing damage from TID can lead to degradation and/or device failure. For example, TID can cause devices to suffer threshold shifts, increased device leakage and power consumption, timing changes, decreased functionality, etc.

SUMMARY

In an aspect of the disclosure, a structure comprises: an active device; a heater element under the active device and within a semiconductor substrate; and a contact to the heater element and the active device.

In an aspect of the disclosure, a structure comprises: a heterojunction bipolar transistor integrated with a semiconductor substrate; a heater element in the semiconductor substrate and which surrounds the heterojunction bipolar transistor; a common contact to the heterojunction bipolar transistor and the heater element; and a shallow trench isolation structure isolating the heterojunction bipolar transistor from the heater element.

In an aspect of the disclosure, a structure comprises: an active device; a heater element surrounding the active device; a performance sensor configured to detect a change in performance of the active device; a heat sensor configured to detect heat generated from the heater element; and control circuitry configured to activate the heater element when the performance sensor detects performance degradation in the active device.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
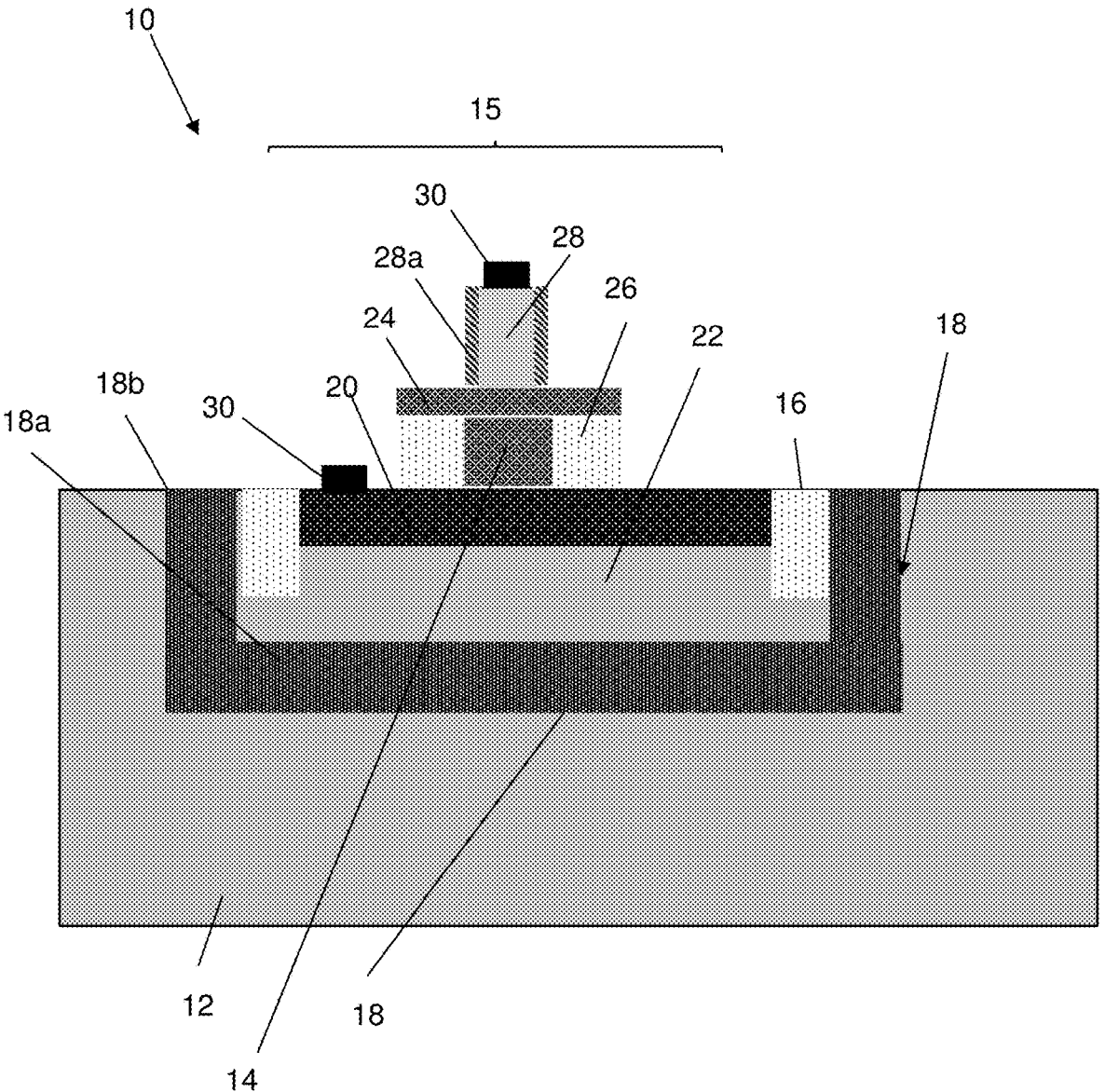
FIG. 1 shows a heater element and a transistor, amongst other features, and respective fabrication processes in accordance with aspects of the present disclosure.

The present disclosure relates to semiconductor structures and, more particularly, to heater elements, methods of operation and methods of manufacture. More specifically, the present disclosure relates to heater elements comprising a buried isolation layer in a semiconductor material, below bipolar transistors. For example, the heater element may include an N-type isolation layer which can thermally anneal oxide interface traps that may be generated by, e.g., total ionizing dose (TID)) or single even transients (SETs), e.g., single-event upsets (SEU). Accordingly, and advantageously, the present disclosure provides a mechanism for annealing structures (e.g., insulator material) in bipolar transistors to repair for damage caused by SEU and TID events.

In one exemplary embodiment, a SiGe heterojunction bipolar transistor (HBT) comprises a heater element. The heater element may be a N-type (e.g., implanted) semiconductor layer beneath a sub-collector of an NPN transistor. The heater element is electrically isolated from the sub-collector by a P-isolation region (e.g., implanted collector region) of semiconductor material and a shallow trench isolation structure. In embodiments, the heater element may be electrically connected to reach throughs (e.g., contacts) filled with N-doped polysilicon or metal material. In this way, the heater element can completely surround the active device, e.g., HBT. In further embodiments, a reach-through contact could completely surround the device (e.g., ring reach-thru) to prevent diffusion of a p-type isolation region from coming in direct contact with the substrate laterally. An airgap and trap-rich region below the heater element may be used to increase the efficiency of the heater element and improve SET response. In operation, logic can detect a change in circuit performance due to radiation damage which enables the heater element to repair or heal the degradation.

The heater elements of the present disclosure can be manufactured in a number of ways using a number of different tools. In general, though, the methodologies and tools are used to form structures with dimensions in the micrometer and nanometer scale. The methodologies, i.e., technologies, employed to manufacture the heater elements of the present disclosure have been adopted from integrated circuit (IC) technology. For example, the structures are built on wafers and are realized in films of material patterned by photolithographic processes on the top of a wafer. In particular, the fabrication of the heater elements uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

FIG. 1 shows a heater element and a transistor, amongst other features, and respective fabrication processes in accordance with aspects of the present disclosure. More specifically, the structure 10 of FIG. 1 includes an active device 15 integrated with a semiconductor substrate 12. A heating element 18 may be provided within the semiconductor substrate 12, below the active device 15. As described in more detail below, a main body 18*a* and legs (e.g., reach-throughs) 18*b* of the heating element 18 may be resistive elements comprising N-type material which can be heated through application of a current. The legs 18*b* of the heater element 18 may surround the active device 15. The legs 18*b* may alternatively be polysilicon material or metal material, which electrically connect to the main body 18*a*.

The semiconductor substrate 12 may be a P-type substrate. In more specific embodiments, the semiconductor substrate 12 may be a bulk substrate comprising Si. The semiconductor substrate 12 may also be other appropriate semiconductor substrates, e.g., SiGe, SiGeC, SiC, GaAs, InAs, InP, and other III/V or II/VI compound semiconductors.

The active device 15 may be a heterojunction bipolar transistor (HBT) or another active device. For example, in an HBT, a sub-collector region 20 may be above an isolation region 22, e.g., P-well. In embodiments, the sub-collector region 20 may be an N-type region formed by an ion implantation process or an epitaxial growth process as is known in the art. The isolation region 22 may be a P+ region formed by an ion implantation process or an epitaxial growth process as is known in the art. The heater element 18 may be separated (e.g., electrically isolated) from the sub-collector region 20 by the isolation region 22. In this way, the heater element 18 does not electrically connect to the sub-collector region 20. A collector region 14 may be above the sub-collector region 20.

A base region 24 (e.g., intrinsic and extrinsic base) may be between the sub-collector region 20 and the collector region 14. The base region 24 may be SiGe material surrounded by an insulator material 26. In embodiments, the base region 24 may be T-shape. The base region 24 may be formed by deposition of SiGe material, followed by conventional lithography and etching processes as described herein. The deposition process may be a conventional deposition process such as, e.g., chemical vapor deposition (CVD). The insulator material 26 may also be deposited by a CVD process, followed by a conventional CMOS patterning process (e.g., lithography and etching).

An emitter 28 may be formed in contact with the base region 24. In embodiments, the emitter 28 may be a polysilicon material, with sidewall spacers 28*a*. The sidewall spacers 28*a* may be an oxide and/or nitride material. The emitter 28 and sidewall spacers 28*a* may be deposited by any known deposition process, e.g., CVD, followed by a patterning process as described herein. For the sidewall spacers 28*a*, for example, the oxide and/or nitride material may be blanket deposited over the patterned emitter 28, followed by an anisotropic etching process.

Contacts 30 may be provided to the sub-collector region 20 and the emitter 28. In embodiments, the contact 30 to the sub-collector region 20 may also be used to provide a current to the heater elements 18. The current applied to the heater elements 18 results in the heater element (e.g., resistive element) generating heat to anneal or repair damage of the active device. In further embodiments, the isolation region 22 may be left floating.

The contacts 30 may include a silicide contact formed using a silicide process. As should be understood by those of skill in the art, the silicide process begins with deposition of a thin transition metal layer, e.g., nickel, cobalt or titanium, over fully formed and patterned semiconductor devices (e.g., sub-collector region 20 and the emitter 28). After deposition of the material, the structure is heated allowing the transition metal to react with exposed silicon (or other semiconductor material as described herein) in the active regions of the semiconductor device (e.g., sub-collector region 20 and the emitter 28) forming a low-resistance transition metal silicide. Following the reaction, any remaining transition metal is removed by chemical etching, leaving silicide contacts in the active regions of the device.

In embodiments, the active device 15 may be isolated by shallow trench isolation structures 16. The shallow trench isolation structures 16 may provide isolation for charge collection and heat retention from the heater element 18. The shallow trench isolation structures 16 may also provide electrical isolation between the sub-collector region 20 and the heater element 18, e.g., legs or reach throughs 18*b* of the heater element 18.

The shallow trench isolation structures 16 can be formed by conventional lithography, etching and deposition methods known to those of skill in the art. For example, a resist formed over the semiconductor substrate 12 is exposed to energy (light) and developed utilizing a conventional resist developer to form a pattern (opening). An etching process with a selective chemistry, e.g., reactive ion etching (RIE), will be used to transfer the pattern to form one or more trenches in the semiconductor substrate 12 through the openings of the resist. Following the resist removal by a conventional oxygen ashing process or other known stripants, an insulator material, e.g., SiO$_2$, can be deposited by any conventional deposition processes, e.g., chemical vapor deposition (CVD) processes. Any residual material on the surface of the semiconductor substrate 12 can be removed by conventional chemical mechanical polishing (CMP) processes.

The sub-collector region 20, isolation region 22 and heater element 18 may be formed by separate ion implantation processes or separate epitaxial growth processes with in-situ doping processes. As an example using ion implantation processes, the sub-collector region 20, isolation region 22 and heater element 18 may be formed by introducing a concentration of a different dopant types in the semiconductor substrate 12. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The isolation region 22 may be doped with P-type dopants, e.g., Boron (B), whereas the sub-collector region 20 and heater element 18 may be doped with N-type dopants, e.g., Arsenic (As), Phosphorus (P) and Sb, among other suitable examples.

In preferred embodiments, the heater element 18 may be formed using Phosphorus (P) in a deep ion implantation process, and the sub-collector region 20 may be formed using Arsenic (As) or Phosphorus (P) in a shallower ion implantation process. Also, depending on the dosage and concentration of the dopants, the heater element 18 may be about 1.0 to 1.5 microns deep in the semiconductor substrate 12; whereas a bottom surface of the sub-collector region 20 may be about 0.3 microns deep in the semiconductor substrate 12. The isolation region 22 may be about 0.3 microns thick, which isolates the sub-collector region 20 from the heater element 18. In any layout design, the heater element, e.g., main body 18*a*, is preferably below the shallow trench isolation structures 16. It should be recognized, though, that other dimensions may also be contemplated herein, depending on the desired device performance, heating parameters, etc.

In further embodiments, the legs 18b of the heater element 18 may alternatively be fabricated using a polysilicon material or a metal material. In these implementations, a trench may be formed in the semiconductor substrate 12, extending to the main body 18a of the heater element 18. A polysilicon material or metal material may be deposited in the trench to form the legs 18b using conventional CVD processes. A chemical mechanical planarization (CMP) process may be used to planarize or remove any excessive material from the surface of the semiconductor substrate 12.

As further shown in FIG. 1, the sub-collector region 20 and the heater element 18 may be separated from one another to prevent a shorting between the N-type regions. For example, in preferred embodiments, the isolation region 22 (P-type region) isolates the sub-collector region 20 from the heater element 18. Also, the main body 18a of the heater element 18 is electrically connected to the legs 18a (e.g., reach throughs), with the legs 18a extending below the shallow trench isolation regions 16 within the semiconductor substrate 12.

In operation, the heater element 18 (e.g., resistive element) can generate heat by placing a current into the heater element 18. This heat will result in an annealing process (e.g., melt) to repair defects in the active device 15. More specifically, the heater element 18 can generate heat through application of a current, e.g., 200° ° C. or greater. In this way, it is possible to anneal radiation electrical-stress-induced defects to the oxide and semiconductor (e.g., Si) interfaces to repair or heal the damage to the active device 15. And, as the sub-collector 20 and the heater element 18 are isolated from one another, any damage repair can happen while the active device 15 is operational (e.g., both device 15 and heater 18 can be ON simultaneously). Accordingly, since the P-well (e.g., isolation region 22) provides sufficient electrical isolation for the circuit to be repaired while operating, there is no need for redundant circuitry.

Figure 2:
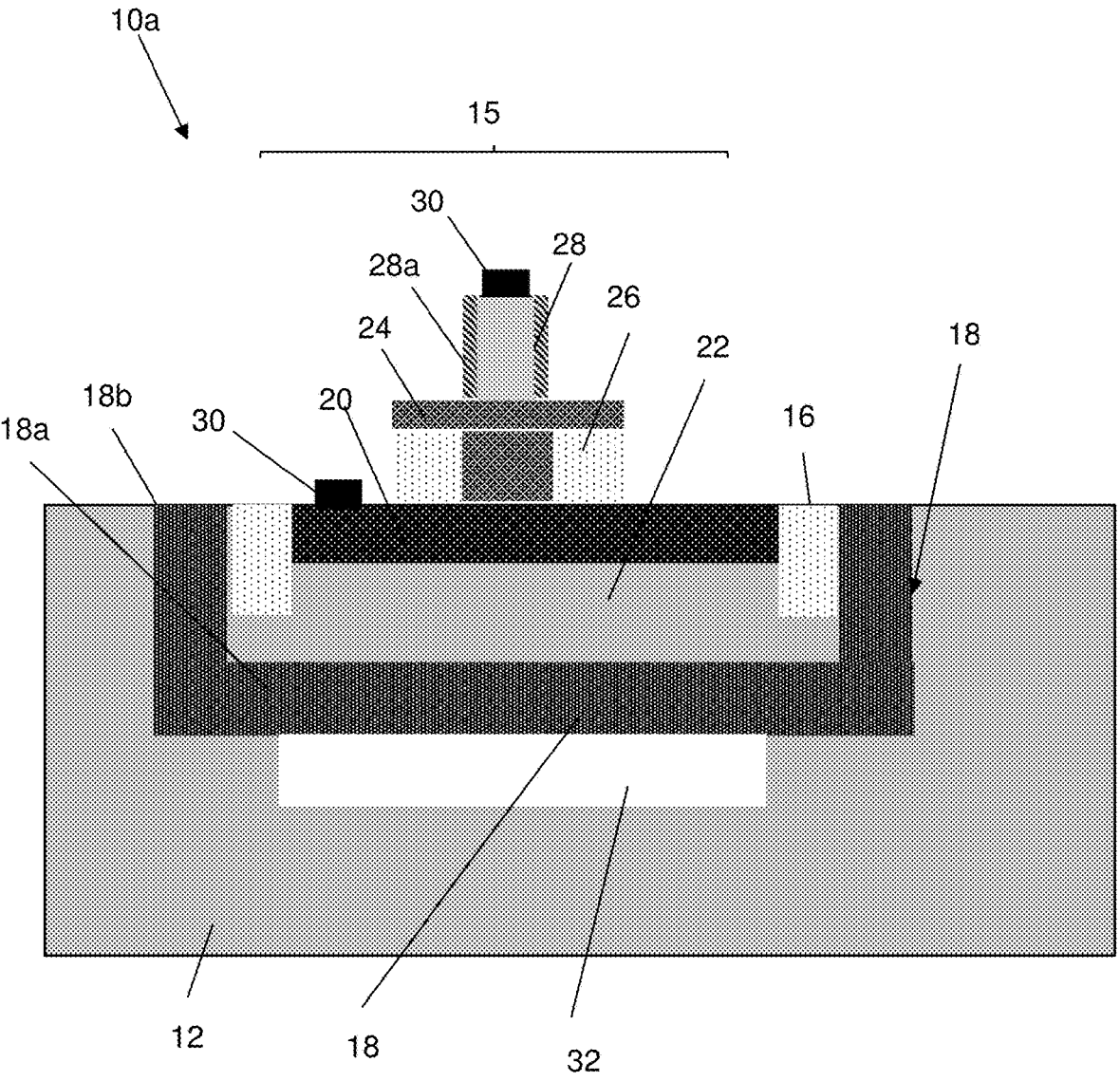
FIGS. 2-6 show heater elements with additional structures, and respective fabrication processes, in accordance with aspects of the present disclosure.

FIG. 2 shows a heater element with an airgap in accordance with aspects of the present disclosure. More specifically, in the structure 10a of FIG. 2, an airgap 32 is provided below the heater element 18. In embodiments, the airgap 32 may be used to concentrate heat upwards toward the active device 15. The remaining features of the structure 10a are similar to the structure 10 of FIG. 1.

The airgap 32 may be fabricated by forming a trench in the semiconductor substrate 12, and filling the trench with semiconductor material different than the semiconductor substrate 12. For example, the trench may be filled with SiGe material using any conventional deposition method, e.g., semiconductor epitaxial growth processes. After the formation of the heater element 18 (and possibly other semiconductor layers) by an epitaxial growth process, the SiGe material may be removed by a selective etching process to form the airgap 32 as is known in the art.

Figure 3:
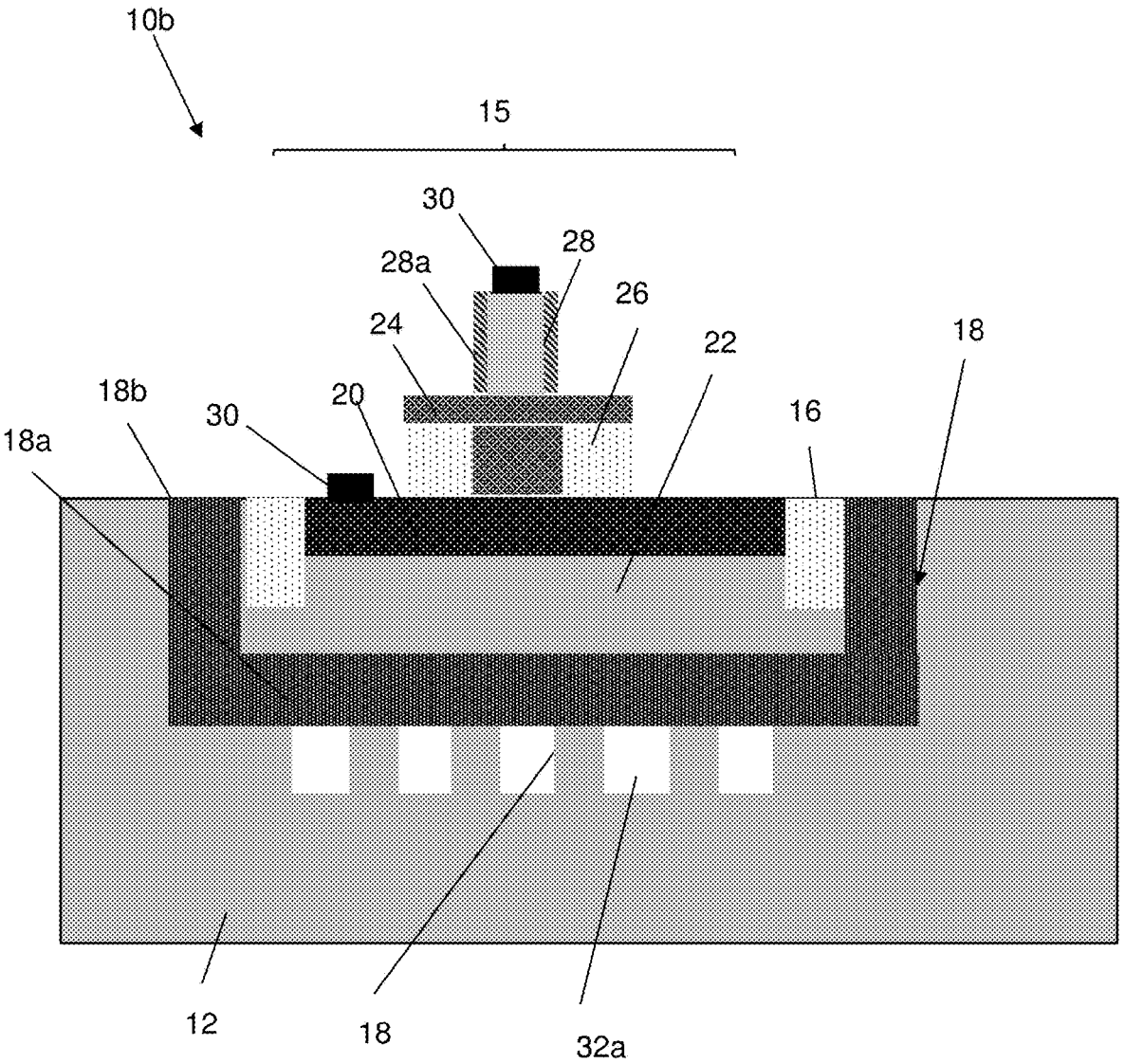

FIG. 3 shows a structure 10b with multiple airgaps 32a provided below the heater element 18. Again, in embodiments, the airgaps 32a may be used to concentrate heat upwards toward the device 15. The multiple airgaps 32a may also reduce self-heating of the active device 15. The remaining features of the structure 10b are similar to the structure 10 of FIG. 1.

Figure 4:
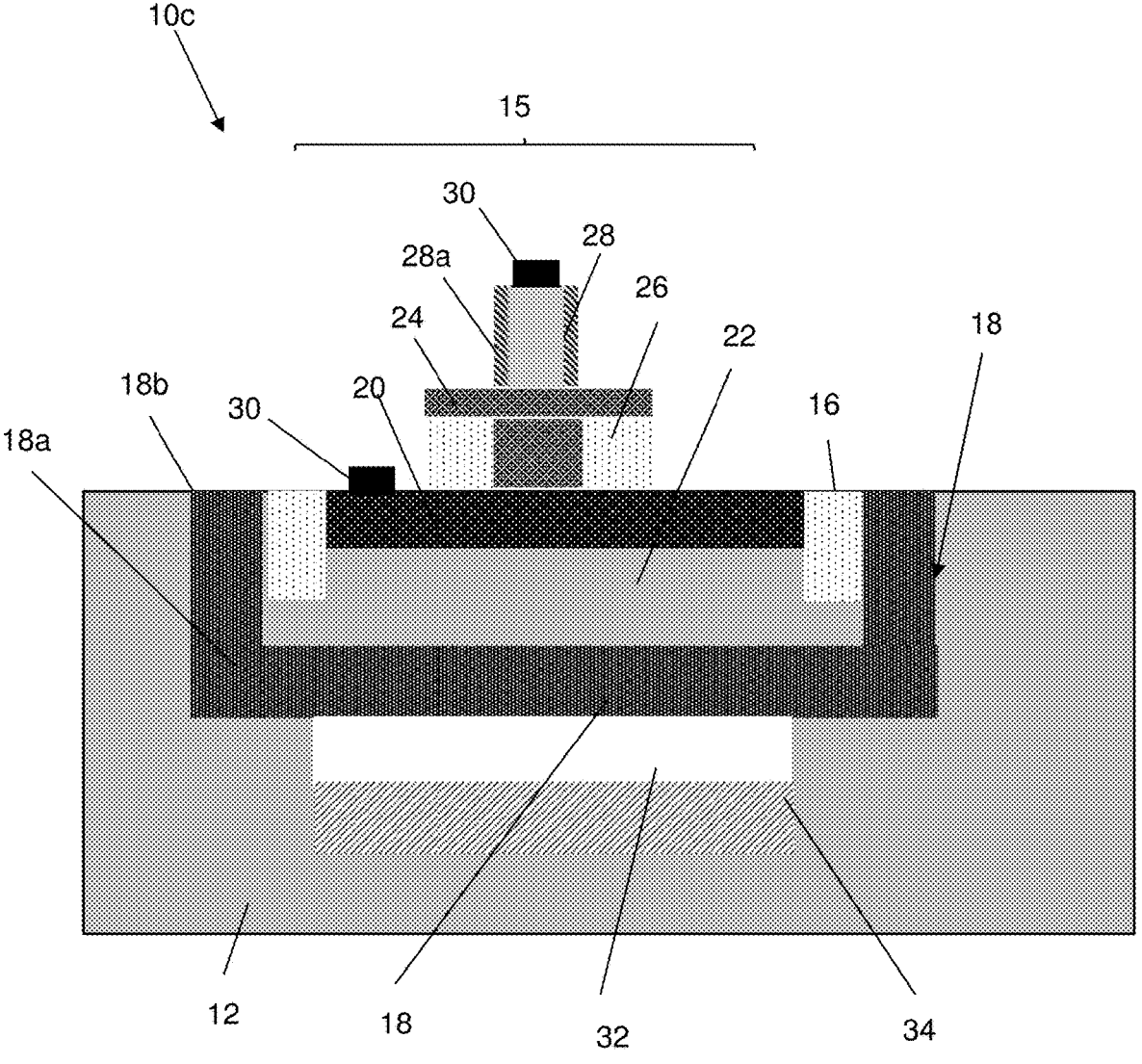

In FIG. 4, the structure 10c includes a non-single-crystal semiconductor region 34 under the airgap 32. In more specific embodiments, the non-single-crystal semiconductor region 34 may be a trap rich region and, more specifically, an amorphous region or polysilicon region. In embodiments, the non-single-crystal semiconductor region 34 may reduce the effects of TID. For example, the non-single-crystal semiconductor region 34 can help recombine charge and attenuates SETs quicker. The remaining features of the structure 10c are similar to the structure 10a of FIG. 2.

The non-single-crystal semiconductor region 34 may be formed by an implantation process, using a patterned implantation mask. For example, the non-single-crystal semiconductor region 34 may be formed by a blanket implant process using argon; although the use of any non-dopant or noble gas is contemplated herein for the implantation process. As an illustrative, non-limiting example, the semiconductor substrate 12 can be subjected to an argon implant at 300 KeV and a dose of $1\times10^{15}$ cm$^{-2}$. By way of further illustrative examples, other implant parameters and inert gases are contemplated herein depending on the desired thickness and depth of the implant region including, e.g., the ion dose may be less than or greater than $1\times10^{15}$ cm$^{-2}$ or within a range of $1\times10^{13}$ cm$^{-2}$ to $5\times10^{16}$ cm$^{-2}$.

Figure 5:
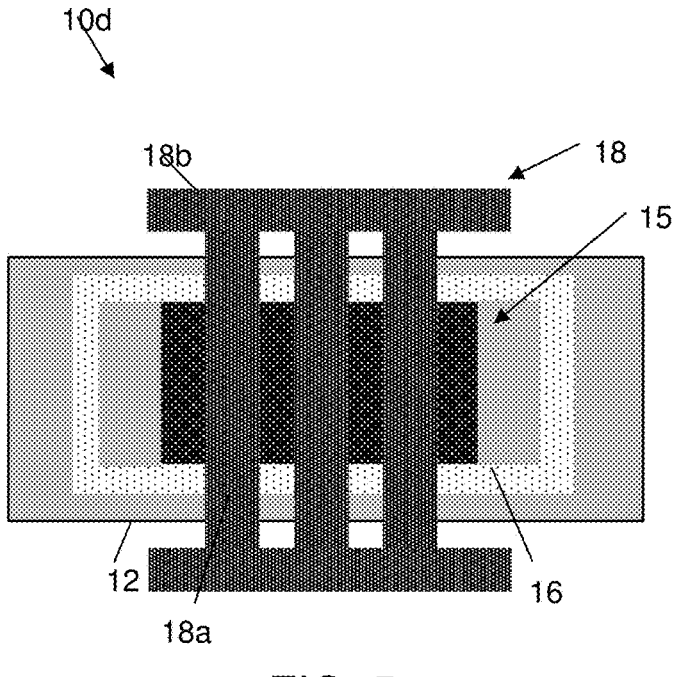

FIG. 5 shows a structure 10d with a heater element 18 with multiple main bodies 18 (e.g., fingers), electrically connected to the legs 18b. In this way, the heater element includes multiple finger elements. The remaining features of the structure 10d are similar to the structure 10 of FIG. 1. It should also be recognized by those of skill in the art that the structure 10d (as with any of the embodiments) may include one or more airgaps and/or the non-single-crystal semiconductor region.

Figure 6:
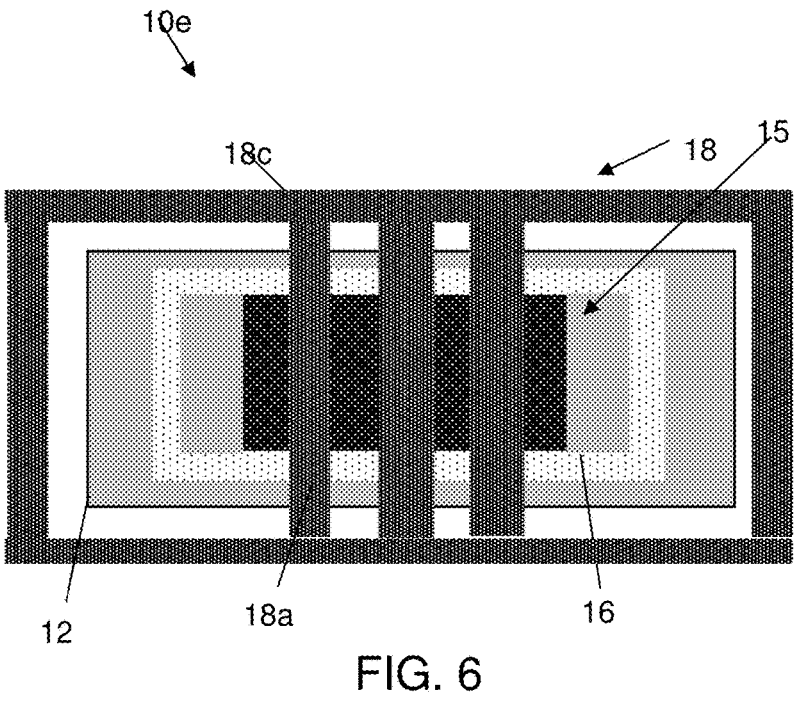

FIG. 6 shows a structure 10e with a heater element 18 with multiple main bodies 18 (e.g., fingers), electrically connected to a ring 18c. In this way, the ring 18c, e.g., reach-through contact, may completely surround the device 15 to prevent diffusion of a p-type isolation region from coming in direct contact with the substrate laterally. The remaining features of the structure 10e are similar to the structure 10d of FIG. 5. It should also be recognized by those of skill in the art that the structure 10e (as with any of the embodiments) may include one or more airgaps and/or the non-single-crystal semiconductor region.

Figure 7:
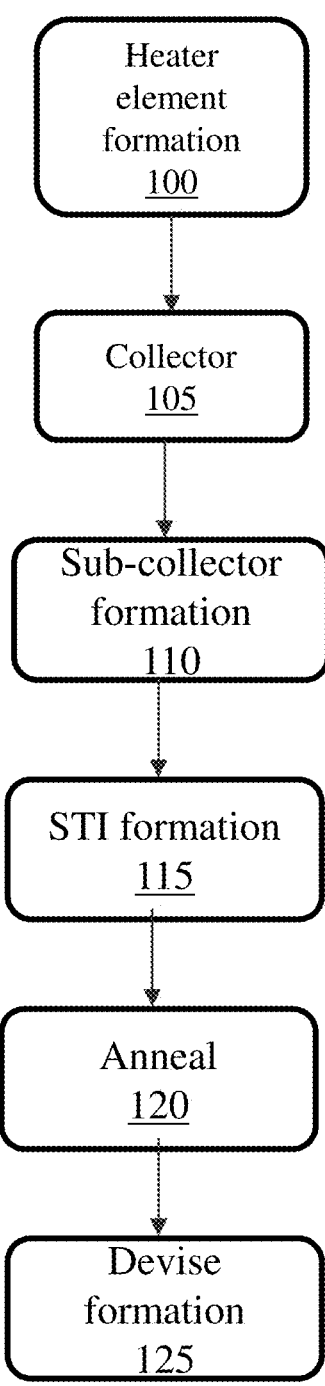
FIG. 7 shows a representative flow of a manufacturing process for fabricating the structure shown in FIG. 1, in accordance with aspects of the present disclosure.

FIG. 7 shows a representative flow of a fabrication process for manufacturing the structure 10 of FIG. 1. Similar fabrication processes may be used for the structures shown in FIGS. 1-6. At step 100, a deep ion implantation process with an N-type dopant may be performed on the semiconductor layer 12 to form the heater element 18. At step 105, an ion implantation process with a P+ type dopant may be performed on the semiconductor layer 12 to form the isolation region 22. At step 110, an ion implantation process with an N-type dopant may be performed on the semiconductor layer 12 to form the sub-collector region 20. At step 115, the shallow trench isolation structures 16 may be formed by conventional lithography, etching and deposition processes as described above. At step 120, an anneal process may be performed to drive in the dopants of the previous implant processes as is known in the art. At step 125, the device 15 may be formed using conventional CMOS processes such that no further explanation is required for a complete understanding of the present disclosure.

Figure 8:
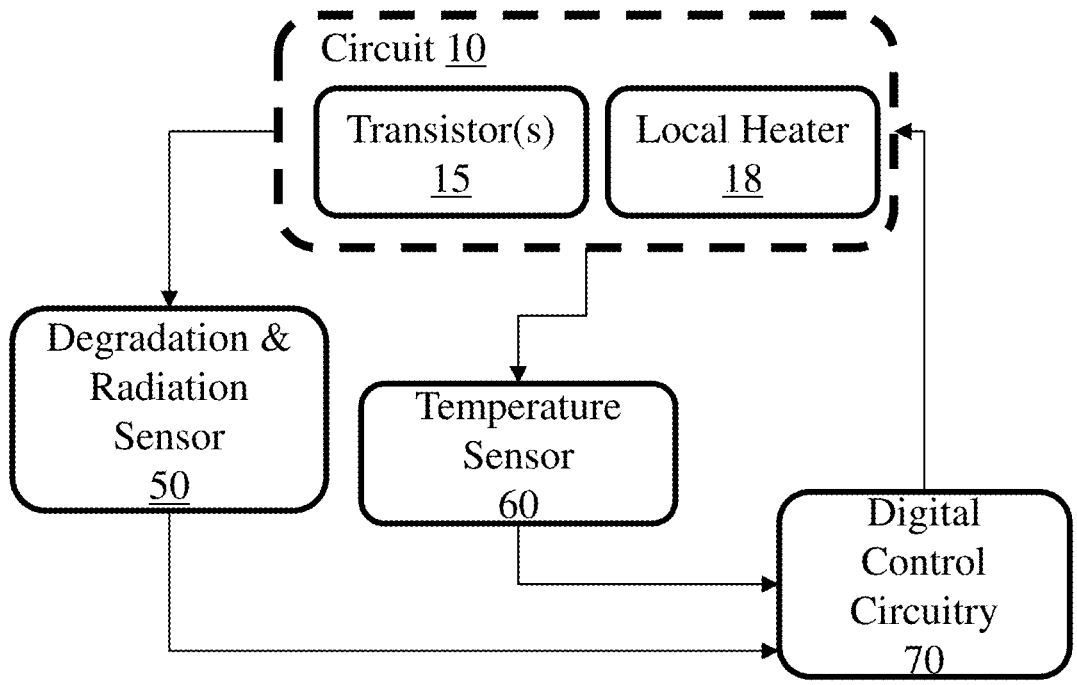
FIG. 8 shows a representative flow of an operation of the structures shown in FIGS. 1-6, with additional operational components in accordance with aspects of the present disclosure.

FIG. 8 shows a representative flow of an operation of the structures shown in FIGS. 1-6, with additional operational components in accordance with aspects of the present disclosure. More specifically, the flow includes the structure 10 (e.g., circuit) with the active device 15 and the heater element 18, in addition to a degradation and radiation sensor 50, temperature sensor 60 and digital control circuitry 70.

In operation, the degradation and radiation sensor 50 will sense the radiation, e.g., TID, and degradation of the device 15. For example, the degradation and radiation sensor 50 may sense a change in circuit performance due to radiation damage. The information from the degradation and radiation sensor 50 is fed into a digital control circuit 70 that governs whether a device should be heated to anneal defects in the device. While the device 15 is being heated for repair, its temperature is sensed using a separate temperature sensor 60. The temperature is maintained in a negative feedback loop through the digital control circuit 70 to ensure that the device is not overheated, hence, not impaired by the heating process.

The heater elements can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
an active device;
a heater element under the active device and within a semiconductor substrate;
a contact to the active device and providing current to the heater element; and
an airgap below the heater element.

2. The structure of claim 1, wherein the active device comprises a heterojunction bipolar transistor comprising a collector region, a sub-collector region, a base region and an emitter and the semiconductor substrate comprises a bulk substrate.

3. The structure of claim 2, wherein the contact is electrically connected to the collector region.

4. The structure of claim 2, wherein the heater element is separated from the sub-collector region by an isolation region of the active device.

5. The structure of claim 4, wherein the heater element is electrically isolated from the sub-collector region by shallow trench isolation structures.

6. The structure of claim 2, wherein the heater element and the sub-collector region comprise an N-type semiconductor material.

7. The structure of claim 1, wherein the heater element includes a main body and a reach through extending from a surface of the semiconductor substrate to the main body.

8. The structure of claim 1, further comprising a non-single crystal semiconductor region below the airgap.

9. The structure of claim 1, further comprising a plurality of airgaps below the heater element.

10. The structure of claim 1, wherein the heater element includes multiple fingers.

11. The structure of claim 1, further comprising a performance sensor, a heat sensor and control circuitry, the performance sensor detects a change in circuit performance of the active device, the control circuit receives the circuit performance from the performance sensor and governs whether the active device should be heated to anneal defects, and the heat sensor detects heat generated from the heater element.

12. A structure comprising:
a heterojunction bipolar transistor integrated with a semiconductor substrate;
a heater element in the semiconductor substrate and which surrounds the heterojunction bipolar transistor;
a contact to the heterojunction bipolar transistor and which provides a current the heater element;
a shallow trench isolation structure isolating the heterojunction bipolar transistor from the heater element; and
at least one airgap below the heater element.

13. The structure of claim 12, wherein the heterojunction bipolar transistor comprises a collector region, a sub-collector region, a base region and an emitter, and the contact is electrically connected to the sub-collector region.

14. The structure of claim 13, wherein the heater element and the sub-collector region comprise an N-type semiconductor material, and the heater element is electrically isolated from the sub-collector region by the collector region and the shallow trench isolation structure.

15. The structure of claim 12, wherein the heater element includes a main body and a reach through extending from a surface of the semiconductor substrate to the main body, and the reach through surrounds the shallow trench isolation structure.

16. The structure of claim 12, further comprising a non-single crystal semiconductor region below the at least one airgap.

17. The structure of claim 12, wherein the heater element includes a reach through completely surrounding the heterojunction bipolar transistor.

18. A device structure comprising:
an active device;
a heater element surrounding the active device, wherein the heater element is under the active device and within a semiconductor substrate;
an airgap below the heater element;
a performance sensor configured to detect a change in performance of the active device;

a heat sensor configured to detect heat generated from the heater element; and control circuitry configured to activate the heater element when the performance sensor detects performance degradation in the active device.

\*   \*   \*   \*   \*